United States Patent
Nakamura et al.

(10) Patent No.: US 9,263,773 B2
(45) Date of Patent: Feb. 16, 2016

(54) SECONDARY BATTERY STATE OF CHARGE DETERMINATION APPARATUS, AND METHOD OF DETERMINING STATE OF CHARGE OF SECONDARY BATTERY

(75) Inventors: Masashi Nakamura, Kyoto (JP); Hidefumi Hasegawa, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 420 days.

(21) Appl. No.: 13/522,301

(22) PCT Filed: Jan. 18, 2011

(86) PCT No.: PCT/JP2011/050730
§ 371 (c)(1),
(2), (4) Date: Jul. 13, 2012

(87) PCT Pub. No.: WO2011/090020
PCT Pub. Date: Jul. 28, 2011

(65) Prior Publication Data
US 2012/0293131 A1    Nov. 22, 2012

(30) Foreign Application Priority Data
Jan. 19, 2010   (JP) ................................. 2010-009011

(51) Int. Cl.
*H02J 7/00*      (2006.01)
*H01M 10/42*     (2006.01)
(Continued)

(52) U.S. Cl.
CPC .............. *H01M 10/42* (2013.01); *G01R 31/361* (2013.01); *H01M 10/48* (2013.01); *G01R 31/3648* (2013.01); *G01R 31/3658* (2013.01)

(58) Field of Classification Search
CPC ...................................... H02J 7/00; H02J 7/04
USPC ................ 320/107, 132, 134; 429/50; 702/63
See application file for complete search history.

(56) References Cited

U.S. PATENT DOCUMENTS

| 6,127,806 | A | 10/2000 | Tanjo et al. |
| 7,830,121 | B2 * | 11/2010 | Sasaki ........................... 320/134 |

(Continued)

FOREIGN PATENT DOCUMENTS

| EP | 2 259 080 A1 | 12/2010 |
| JP | H 11-326472 A | 11/1999 |

(Continued)

OTHER PUBLICATIONS

International Search Report in PCT/JP2011/050730 dated Apr. 12, 2011 (English Translation Thereof).

(Continued)

*Primary Examiner* — Richard Isla Rodas
*Assistant Examiner* — Dung V Bui
(74) *Attorney, Agent, or Firm* — McGinn IP Law Group, PLLC

(57) ABSTRACT

A technology described herein is for accurately determining the SOC of a secondary battery. An open-circuit-voltage-to-state-of-charge (OCV-SOC) characteristic has a capacity decrease estimation OCV region in which a relationship between the OCV and the SOC is assumed not to change due to degradation of the secondary battery 1a since a reference time point. Charge currents or discharge currents in the capacity decrease estimation OCV region are accumulated in a process in which the secondary battery SOC changes among OCVs. From the accumulation, an accumulated current is obtained. A secondary battery capacity decrease is estimated based on the accumulated current. An OCV-SOC characteristic is specified based on the estimated secondary battery capacity decrease and a predetermined relationship between the battery capacity decrease of the secondary battery since the reference time point and the OCV-SOC characteristic. A secondary battery SOC is determined based on the OCV and the specified OCV-SOC characteristic.

7 Claims, 4 Drawing Sheets

(51) Int. Cl.
*G01R 31/36* (2006.01)
*H01M 10/48* (2006.01)

(56) References Cited

U.S. PATENT DOCUMENTS

| | | | | |
|---|---|---|---|---|
| 8,187,735 | B2* | 5/2012 | Chiang et al. | 429/50 |
| 8,446,127 | B2* | 5/2013 | Yazami et al. | 320/132 |
| 8,615,372 | B2* | 12/2013 | Tomura et al. | 702/63 |
| 8,653,793 | B2* | 2/2014 | Ueki et al. | 320/132 |
| 2006/0261782 | A1* | 11/2006 | Kim et al. | 320/132 |
| 2009/0112496 | A1* | 4/2009 | Suzuki | 702/63 |
| 2012/0293131 | A1* | 11/2012 | Nakamura et al. | 320/134 |

FOREIGN PATENT DOCUMENTS

| | | |
|---|---|---|
| JP | 2002-243813 A | 8/2002 |
| JP | 2002-286818 A | 10/2002 |
| JP | 2003-068369 A | 3/2003 |
| JP | 2004-354148 A | 12/2004 |
| JP | 2006-012433 A | 1/2006 |

OTHER PUBLICATIONS

European Search Report dated Sep. 1, 2015.

* cited by examiner

SECONDARY BATTERY STATE OF CHARGE DETERMINATION APPARATUS, AND METHOD OF DETERMINING STATE OF CHARGE OF SECONDARY BATTERY

TECHNICAL FIELD

The present invention relates to a secondary battery state of charge determination apparatus for determining a state of charge of a secondary battery based on predetermined open-circuit-voltage-to-charging-condition characteristics, and a method of determining a state of charge of a secondary battery.

BACKGROUND ART

A secondary battery state of charge determination apparatus and a method of determining a state of charge of a secondary battery are for measuring values related to state of charge required for controlling charging and discharging of the secondary battery. The state of charge may be hereinafter referred to as SOC (state of charge).

The SOC a ratio of a remaining capacity of the secondary battery at a specific time point to a remaining capacity of the secondary battery at full charge (i.e., a capacity of the secondary battery).

A method of determining the SOC of a secondary battery may use open-circuit-voltage-to-charging-condition characteristics to determine the SOC based on an open circuit voltage (may be hereinafter referred to as OCV) as disclosed in Patent Document 1. In another method, charge and discharge currents for a secondary battery are accumulated, and a ratio of the accumulated current to a total capacity is calculated as the SOC.

The latter method in which the charge and discharge currents of the secondary battery are accumulated normally uses an initial total capacity as the total capacity of the secondary battery, which is a denominator used in a calculation of the SOC. If the capacity of the battery decreases due to degradation of the secondary battery, the calculated SOC is more likely to include an error.

The former method is widely used former because open-circuit-voltage-to-charging-condition characteristics (may be hereinafter referred to as OCV-SOC characteristics) are considered not to change even if the total capacity of the secondary battery varies due to the degradation thereof.

RELATED ART DOCUMENT

Patent Document

Patent Document 1: Japanese Unexamined Patent Publication No. 2003-68369

SUMMARY OF INVENTION

Problems to be Solved by the Invention

An accurate SOC may not be obtained in some cases by the method in which the SOC is determined simply based on the OCV using the OCV-SOC characteristics.

The present invention was made in view of the foregoing circumstances. An object of the present invention is to accurately determine the SOC of a secondary battery.

Means for Solving the Problem

A first distinctive configuration of a secondary battery state of charge determination apparatus according to the present invention is that the secondary battery state of charge determination apparatus includes: an open circuit voltage measuring means for measuring open circuit voltages of a secondary battery; a current accumulating means for accumulating charge currents to the secondary battery or discharge currents from the secondary battery; a memory means for storing relationships between secondary battery capacity decreases since a reference time point and open-circuit-voltage-to-state-of-charge (OCV-SOC) characteristics, and a battery capacity or a value related to a secondary battery capacity at the reference time point, each of the relationships between each of the secondary battery capacity decreases and the corresponding one of the OCV-SOC characteristics; and a state of charge determining means for controlling the current accumulating means to accumulate the charge currents or the discharge currents in a process in which a secondary battery state of charge changes between a plurality of the open circuit voltages in a capacity decrease estimation open circuit voltage region in which the relationship between the open circuit voltage and the state of charge is assumed not to change due to degradation of the secondary battery capacity decrease based on the accumulated currents and the battery capacity or the value related to the secondary battery capacity at the reference time point, for determining an OCV-SOC characteristic based on the estimated secondary battery capacity decrease and the predetermined relationship between the battery capacity decrease of the secondary battery since the reference time point and the OCV-SOC characteristic, and for determining a secondary battery state of charge based on the open circuit voltage measured by the open circuit voltage measuring means and the determined OCV-SOC characteristic.

It has been considered that the OCV-SOC characteristics do not vary due to degradation of the secondary battery. However, it is now considered that the OCV-SOC characteristics of some secondary batteries may vary. Moreover, the variation has a certain characteristic.

Namely, the OCV-SOC characteristics do not vary with irregularity in entire regions thereof due to the degradation of the secondary battery. In some regions, the OCV-SOC characteristics vary due to the degradation of the secondary battery; however, the OCV-SOC characteristics do not vary due to the degradation of the secondary battery in other regions as it has been considered. This tendency is noticeable in a secondary battery including a cathode active material made of two or more kinds of lithium-containing metal oxides mixed together.

Variations in the OCV-SOC characteristics of the secondary battery due to the degradation of the secondary battery may be estimated in advance. If the OCV-SOC characteristics of the secondary battery vary due to the degradation of the secondary battery, determination of the SOC using the OCV-SOC characteristics can be performed based on a result of a degradation level determination on the secondary battery.

The degradation level determination on the secondary battery may be performed in the region in which the OCV-SOC characteristics do not change.

In the region in which the OCV-SOC characteristics do not change due to the degradation of the secondary battery, the accumulated current is obtained by accumulating the charge currents or the discharge currents in the process in which the secondary battery state of charge changes between a plurality of the open circuit voltages.

In this open circuit voltage region, the relationships between the open circuit voltages and the states of charge of the secondary battery are uniquely determined regardless of the degradation levels of the secondary battery. Therefore, the accumulated current corresponds to the variation in state of charge and thus the battery capacity at the measurement time point can be virtually obtained.

The battery capacity decrease since the reference time point can be estimated by comparing the battery capacity with the battery capacity at the reference time point.

Time when the secondary battery is manufactured may be appropriate as the reference time point. However, a user can set time when the user actually starts using the secondary battery as the reference time point.

By determining the relationship between the battery capacity decrease and the OCV-SOC characteristics in advance, an appropriate one of the OCV-SOC characteristics can be specified based on the estimated battery capacity decrease.

The battery capacity decrease since the reference time point corresponds to the degradation level of the secondary battery. If the state of charge is specified based on the measure open circuit voltage using the determined OCV-SOC characteristic, the state of charge in consideration of the variation in the OCV-SOC characteristic due to the degradation of the secondary battery can be determined.

The capacity decrease estimation open circuit voltage region may be a region in which a difference between the open circuit voltage measured at the reference time point and the open circuit voltage measured after the battery capacity is decreased due to degradation under the same charging condition is equal to or lower than 10 mV.

The capacity decrease estimation open circuit voltage region may be a region in which a difference between the open circuit voltage measured at the reference time point and the open circuit voltage measured after the battery capacity is decreased due to degradation under the same charging condition is equal to or lower than 2 mV.

The accumulated current may be obtained in the open circuit voltage region in which the state of charge in the OCV-SOC characteristic is lower than 100%.

The accumulated current may be obtained in a region in which the open circuit voltage is equal to or lower than 3.4 V or equal to or higher than 3.8V.

The secondary battery may be a battery including a cathode active material made of two or more kinds of lithium-containing metal oxides mixed together. The secondary battery may be a secondary battery including a cathode active material made of a lithium-containing metal oxide having a spinel structure and a lithium-containing metal oxide having a layered structure mixed together.

The state of charge determining means may be configured for: controlling the open circuit voltage measuring means to measure a plurality of open circuit voltages in the capacity decrease estimation open circuit voltage region; controlling the current accumulating means to accumulate the charge currents or the discharge currents in a process in which the state of charge changes between the open circuit voltages measured by the open circuit voltage measuring means; and estimating the battery capacity decrease based on the open circuit voltages, the accumulated current, and the battery capacity at the reference time point or the value corresponding to the battery capacity at the reference time point.

A second distinctive configuration of a secondary battery state of charge determination apparatus according to the present invention is that the secondary battery state of charge determination apparatus includes: an open circuit voltage measuring device configured to measure an open circuit voltage of a secondary battery; a current accumulating device configured to accumulate charge currents to the secondary battery or discharge currents from the secondary battery; a memory device configured to store relationships between secondary battery capacity decreases since a reference time point and open-circuit-voltage-to-state-of-charge (OCV-SOC) characteristics, and a battery capacity or a value related to a secondary battery capacity at the reference time point, each of the relationships between each of the secondary battery capacity decrease and the corresponding one of the OCV-SOC characteristics; and a state of charge determining device configured to control the current accumulating means to accumulate the charge currents on the discharge currents in a process in which a secondary battery state of charge changes among a plurality of the open circuit voltages in a capacity decrease estimation open circuit voltage region in which the relationship between the open circuit voltage and the state of charge is assumed not to change due to degradation of the secondary battery since the reference time point, to estimate a secondary battery capacity decrease based on the accumulated currents and the battery capacity or the value related to the secondary battery capacity at the reference time point, to specify an OCV-SOC characteristic based on the estimated secondary battery capacity decrease and the predetermined relationship between the battery capacity decrease of the secondary battery since the reference time point and the OCV-SOC characteristic, and to determine a secondary battery state of charge based on the open circuit voltage measured by the open circuit voltage measuring means and the specified OCV-SOC characteristic.

A distinctive configuration of a method of determining a secondary battery state of charge according to the present invention is that the method includes: obtaining an accumulated current by accumulating charge currents or discharge currents in a process in which a secondary battery state of charge changes among a plurality of the open circuit voltages in a capacity decrease estimation open circuit voltage region in which a relationship between an open circuit voltage and a state of charge is assumed not to change due to degradation of the secondary battery since a reference time point; estimating a battery capacity decrease based on the accumulated current and a battery capacity at the reference time point; determining an OCV-SOC characteristic based on the estimated secondary battery capacity decrease and the predetermined relationship between the battery capacity decrease of the secondary battery since the reference time point and the OCV-SOC characteristic; and determining a state of charge based on the measured open circuit voltage and the determined OCV-SOC characteristic.

Namely, as described earlier in the first distinctive configuration of a secondary battery state of charge determination apparatus, in the open circuit voltage region in which the OCv-SOC characteristics do not change due to the degradation of the secondary battery, the relationship between the open circuit voltage and the state of charge of the secondary battery is obtained in the process in which the secondary battery state of charge changes among the open circuit voltages in the capacity decrease estimation open circuit voltage region in which the relationship between the open circuit voltage and the state of charge is assumed not to change due to degradation of the secondary battery since a reference time point. Therefore, the accumulated current corresponds to the variation in state of charge and thus the battery capacity at the measurement time point can be virtually obtained.

The battery capacity decrease since the reference time point can be estimated by comparing the battery capacity with the battery capacity at the reference time point.

By determining the relationship between the battery capacity decrease and the OCV-SOC characteristics in advance, an appropriate one of the OCV-SOC characteristics can be specified based on the estimated battery capacity decrease.

The battery capacity decrease since the reference time point corresponds to the degradation level of the secondary battery. If the state of charge is specified based on the measure open circuit voltage using the determined OCV-SOC characteristic, the state of charge in consideration of the variation in the OCV-SOC characteristic due to the degradation of the secondary battery can be determined.

The capacity decrease estimation open circuit voltage region may be a region in which a difference between the open circuit voltage measured at the reference time point and the open circuit voltage measured after the battery capacity is decreased due to degradation under the same charging condition is equal to or lower than 10 mV.

The capacity decrease estimation open circuit voltage region may be a region in which a difference between the open circuit voltage measured at the reference time point and the open circuit voltage measured after the battery capacity is decreased due to degradation under the same charging condition is equal to or lower than 2 mV.

The accumulated current may be obtained in the open circuit voltage region in which the state of charge in the OCV-SOC characteristic is lower than 100%.

The accumulated current may be obtained in a region in which the open circuit voltage is equal to or lower than 3.4 V or equal to or higher than 3.8V.

The secondary battery may be a battery including a cathode active material made of two or more kinds of lithium-containing metal oxides mixed together. The secondary battery may be a secondary battery including a cathode active material made of a lithium-containing metal oxide having a spinel structure and a lithium-containing metal oxide having a layered structure mixed together.

Advantageous Effect of the Invention

The secondary battery state of charge determination apparatus and the device according to the present invention have a basic function for determining the SOCs based on the OCV-SOC characteristics using the OCV-SOC characteristics in consideration of the degradation of the secondary battery. Therefore, the SOCs of the secondary battery can be accurately determined.

MODE FOR CARRYING OUT THE INVENTION

An embodiment according to the present invention will be explained with reference to drawings.

Figure 1:
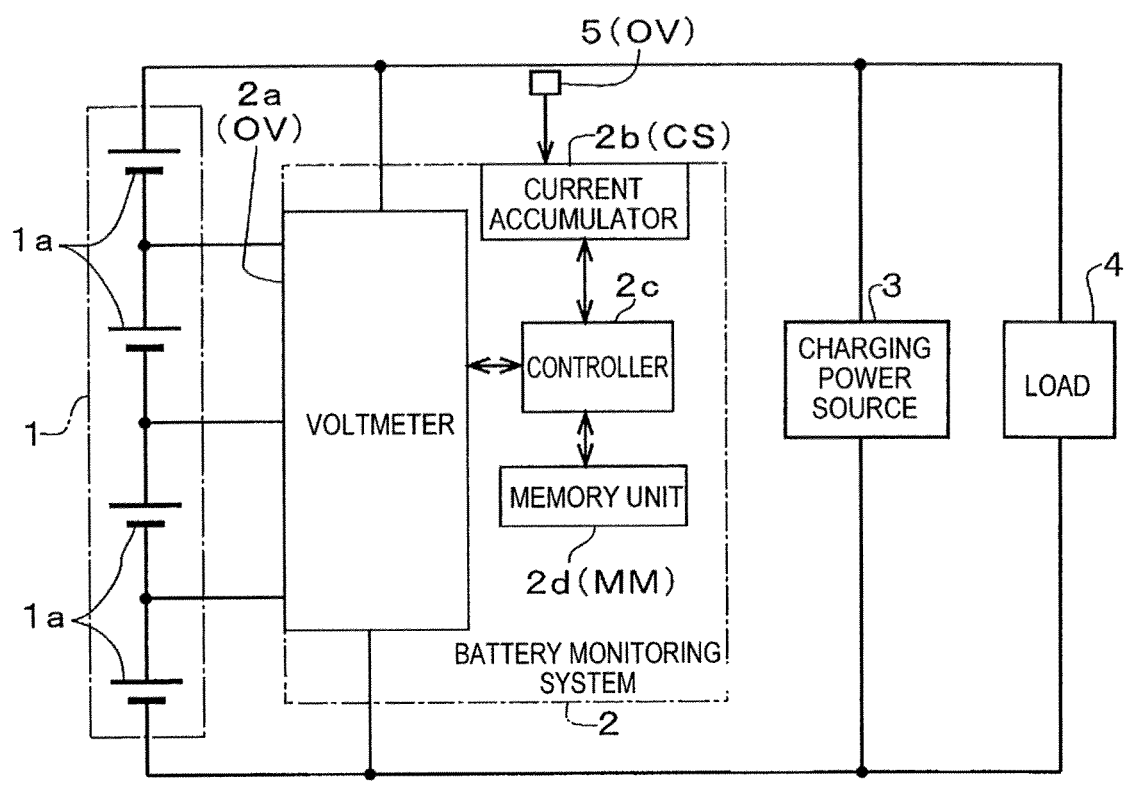
FIG. 1 is a block diagram illustrating an overall configuration according to an embodiment of the present invention.

As schematically illustrated in FIG. 1, a secondary battery state of charge determination apparatus according to this embodiment is provided as a part of a battery monitoring system 2 for monitoring electric cells 1a of an assembled battery 1. Namely, the battery monitoring system 2 functions as a state of charge determination apparatus.

The electric cells 1a are secondary batteries in this embodiment.

More specifically, the electric cells 1a used in this embodiment are lithium ion batteries each including a cathode active material made of two or more kinds of lithium-containing metal oxides.

The lithium-containing metal oxides may include one, two or more kinds of Co, Mn and Ni.

In terms of a crystal structure, a lithium-containing metal oxide having a spinel structure and a lithium-containing metal oxide having a layered structure may be mixed and used as a cathode active material. A typical example of the lithium-containing metal oxide having a layered structure is a cobalt-based $LiCoO_2$, a nickel-based $LiNiO_2$, or a Li—Co—Ni—Mn-based oxide (so-called ternary oxide). A typical example of the lithium-containing metal oxide having the spinel structure is a $LiMn2O_4$.

In this embodiment, the assembled battery 1 is charged by a charging power source 3. A load 4 is connected in parallel to the assembled battery 1 and the charging power source 3. Power is supplied to the load 4 by the assembled battery 1 or the charging power source 3.

The battery monitoring system 2 includes a voltmeter 2a, a current accumulator 2b, a controller 2c and a memory unit 2d. The voltmeter 2a includes an AD converter. The voltmeter 2a measures a voltage (a cell voltage) of each electric cell 1a. The current accumulator 2b is a current accumulating means CS. The current accumulator 2b determines discharge currents and charge currents based on current information from a current detector 5 that detects discharge currents from and charge currents to the assembled battery 1. The current accumulator 2b accumulates the discharge currents and the charge currents. The controller 2c controls operations of the battery monitoring system 2. The memory unit 2d is a memory means MM for storing various kinds of data required for determining state of charge of each battery cell 1a.

The battery monitoring system 2 monitors if the assembled battery 1 properly operates based on data on state of charge (SOC) obtained through the function performed by itself as the state of charge determination apparatus. The battery monitoring system 2 send various control signals to the charging power source 3 as necessary.

A fundamental task of the battery monitoring system 2 is for determining the state of charge using the open-circuit-voltage-to-state-of-charge characteristics (may be hereinafter referred to as the OCV-SOC characteristics) based on the measured open circuit voltages of the electric cells 1a.

The lithium ion batteries in this embodiment have the OCV-SOC characteristics that vary according to degradation of the electric cells 1a.

Variations in the OCV-SOC characteristics due to degradation of the electric cells 1a will be explained in detail.

Figure 2:
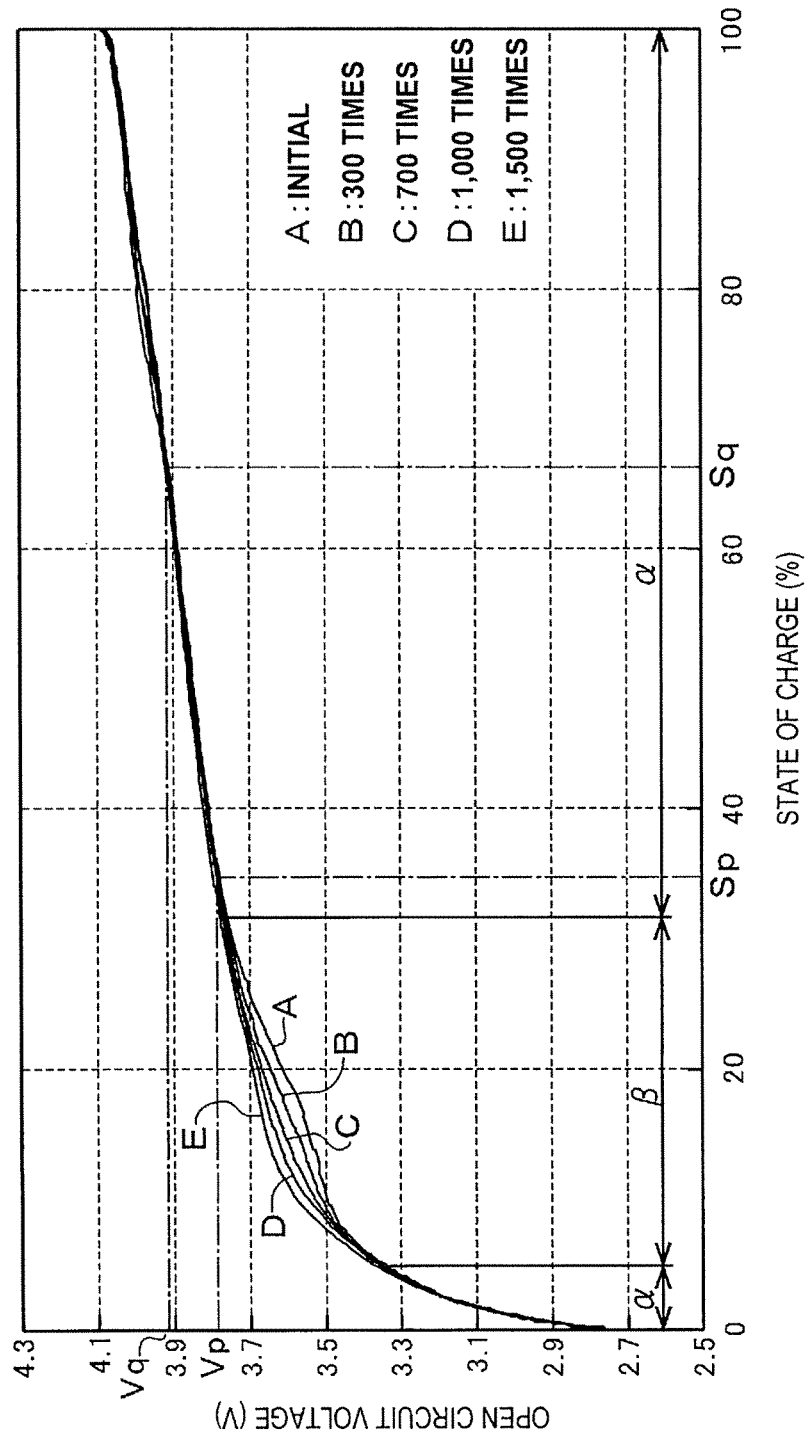
FIG. 2 is an explanatory chart illustrating variations in OCV-SOC characteristics.

An example of the OCV-SOC characteristics of the lithium ion battery in this embodiment is provided in FIG. 2. The OCV-SOC characteristics in FIG. 2 are regarding one of the electric cells 1a. Enforced degradation tests (accelerated degradation tests) at four different levels are performed. The OCV-SOC characteristics obtained from the test results at four levels and initial data (at the time of manufacturing of the battery) are illustrated in FIG. 2. In the example illustrated in FIG. 2, the battery is fully charged when the open circuit voltage is 4.1V.

In FIG. 2, the OCV-SOC characteristic curve indicated by symbol A is an initial OCV-SOC characteristic curve. The OCV-SOC characteristic curves indicated by symbols B to E, respectively, are OCV-SOC characteristic curves obtained from the tests in which the electric cell 1a is enforcedly deteriorated through 300 discharge and charge cycles, 700 discharge and charge cycles, 1,000 discharge and charge cycles, and 1,500 discharge and charge cycles, respectively.

Features of the curves in FIG. 2 include variations in the OCV-SOC characteristics according to degradation of the electric cell 1a. Furthermore, the variations in the OCV-SOC characteristics are not present in entire regions of the OCV-SOC characteristic curves. In regions indicated by symbol α in FIG. 2, the OCV-SOC characteristics rarely vary regardless of degradation levels. In a region indicated by symbol β in FIG. 2, the OCV-SOC characteristics vary according to the degradation levels of the electric cell 1a.

Figure 3:
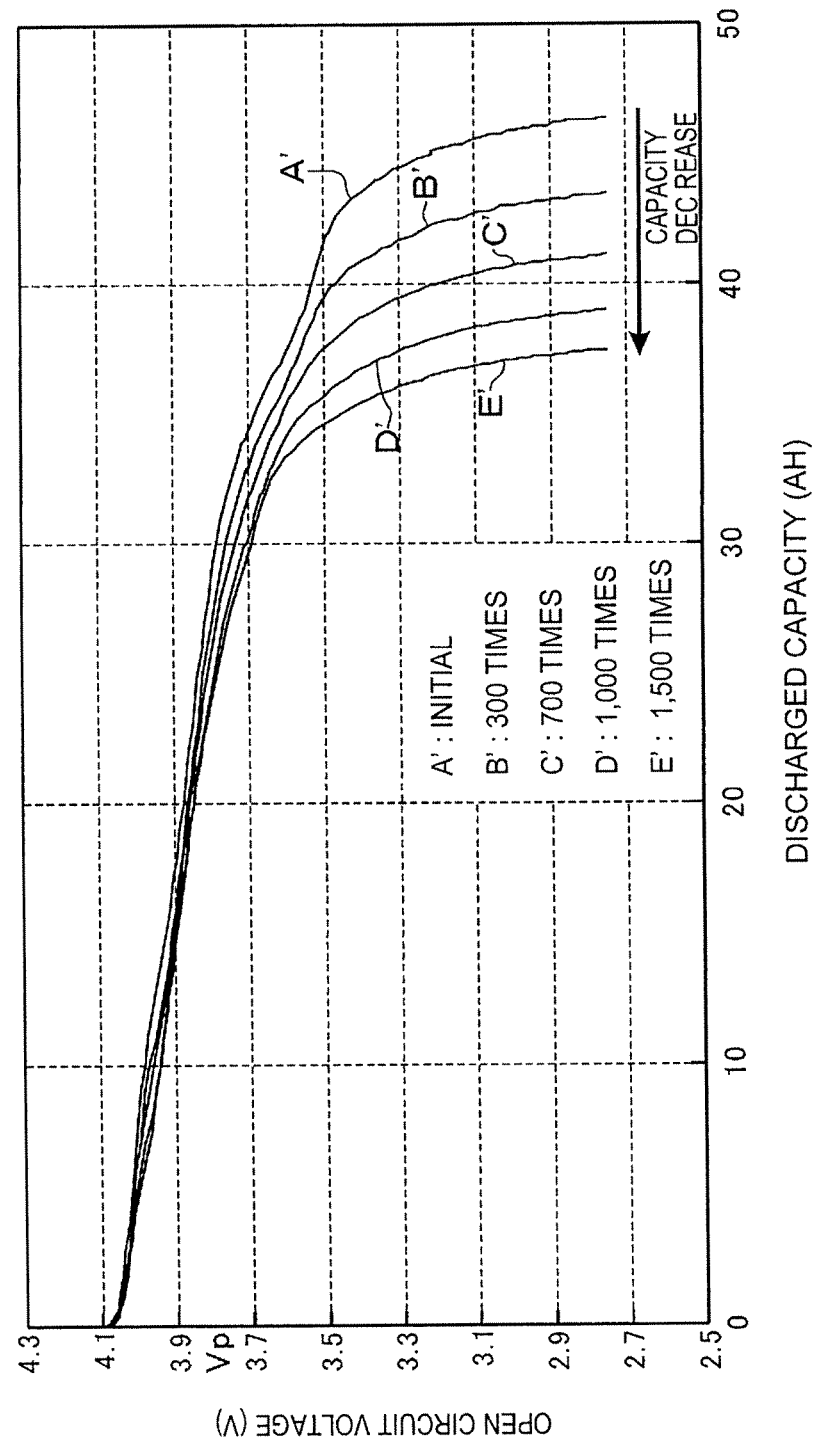
FIG. 3 is a characteristics chart illustrating decreases in capacity of secondary batteries.

Results of measurement to show how the capacity of the electric cell 1a changes in the enforced degradation tests are illustrated in FIG. 3. In FIG. 3, the open circuit voltage and the discharged capacities are plotted on the ordinate and on the abscissa, respectively. The abscissa indicates the quantity of electricity discharged while the voltage decreased from a level of the fully discharged battery to the open circuit voltage on the ordinate.

In FIG. 3, the curve indicated by symbol A' is an initial data curve. The curves indicated by symbols B' to E', respectively, are curves obtained from the tests in which the electric cell 1a is enforcedly deteriorated through 300 discharge and charge cycles, 700 discharge and charge cycles, 1,000 discharge and charge cycles, and 1,500 discharge and charge cycles, respectively.

FIG. 3 illustrates that the battery capacity decreases according to the level of degradation of the electric cell 1a.

The battery monitoring system 2 determines the battery capacity decrease since the reference time point, and estimates the level of degradation of the electric cell 1a based on the determined battery capacity decrease. The battery monitoring system 2 specifies an OCV-SOC characteristic based on the estimated level of degradation, and determines the battery state of charge based on the measured open circuit voltage and the specified OCV-SOC characteristic. The initial time point, that is, the time of manufacturing of the assembled battery 1 is used as the reference time point. However, any time point can be used as the reference time point as long as the same reference time point is used for the different kinds of data.

The battery monitoring system 2 determines the battery capacity at some time point after the start of use of the assembled battery 1 to determine the battery capacity decreases since the initial time point (the reference time point).

The battery monitoring system 2 uses regions of the OCV-SOC characteristic curves indicated by symbol α in FIG. 2.

The regions indicated by symbol α are regions in which the OCV-SOC characteristics do not vary due to the degradation of the electric cell 1a. Therefore, variations in the state of charge can be determined based on the measured open circuit voltages regardless of the degradation of the electric cell 1a.

The current accumulator 2b accumulates the charge currents to the assembled battery 1 or the discharge currents from the assembled battery 1 in a process in which the state of charge of the assembled battery 1 changes among a plurality of the open circuit voltages. Quantities of electricity (the accumulated current) corresponding to the variations in state of charge can be estimated from the variations in measured open circuit voltage can be estimated. Therefore, the battery capacity at the time point can be determined. In this embodiment, to simplify the process, "among a plurality of open circuit voltages" is actually "between two open circuit voltages."

The battery monitoring system 2 compares the battery capacity determined as above with the initial battery capacity (at the reference time point). The battery monitoring system 2 estimates the battery capacity decrease from the initial battery capacity, and determines the level of degradation of the electric cell 1a based on the estimated battery capacity decrease. The battery monitoring system 2 uses the OCV-SOC characteristic that is predetermined in association with the level of the degradation (specifically, the battery capacity decrease from the initial battery capacity) in determination of the state of charge.

The region indicated by symbol α is an open circuit voltage region used for the estimation of the battery capacity decrease.

Under the same charging condition, a difference in open circuit voltage between the electric cell 1a at the reference time point and the electric cell 1a having the decreased battery capacity due to the degradation is about 30 mV at the maximum. The region indicated by symbol α is defined as the open circuit voltage region for the estimation of the battery capacity decrease in which the difference in open circuit voltage is equal to 30 mV or lower.

If the region indicated by symbol α is defined as the open circuit voltage region for the estimation of the battery capacity decrease in which the difference in open circuit voltage is equal to or lower than 10 mV under the same charging condition, the accuracy of the determination of state of charge improves. If the region indicated by symbol .alpha. is defined as the open circuit voltage region for the estimation of the battery capacity decrease in which the difference in open circuit voltage is equal to or lower than 2 mv under the same charging condition, the accuracy of the determination of state of charge further improves.

For a series of the processes described above, the initial battery capacity (at the initial time point) is stored in the memory unit 2d. Furthermore, data on relationships between the battery capacity decreases from the initial battery capacity (at the initial time point) and the OCV-SOC characteristics.

The OCV-SOC characteristic curves illustrated in FIG. 2 are obtained from the enforced degradation tests, and the battery capacity is measured at each level of the degradation. The battery capacity decreases from the initial battery capacity (at the reference time point) are calculated by subtracting the battery capacity decreased due to the degradation from the initial battery capacity. The data on the relationships between the calculated battery capacity decreases and the corresponding OCV-SOC characteristics are stored in a data table in the memory unit 2d.

The above process will be explained using mathematical expressions.

If the open circuit voltage at some time point while the assembled battery 1 is in use is Vp (see FIG. 2), the state of charge Sp is determined based on the OCV-SOC characteristic used at the point. The current accumulator 2b starts the accumulation of the charge currents to the assembled battery 1 or the discharge currents flowing from the assembled battery 1. If both charge currents and discharge currents measure, the charge currents and the discharge currents with an inverted sign from that of the charge currents are accumulated.

When the open circuit voltage Vq is measured (see FIG. 2) while the accumulation of the charge currents or the discharge currents are continued, the state of charge Sq is determined based on the OCV-SOC characteristic used at the time point. Then, the accumulation of the charge currents or the discharge currents is halted and the accumulated current Ci is obtained.

A difference in SOCs between the Vq and Vp expressed by Sq−Sp (%) corresponds to the accumulated current Ci. The battery capacity Crt at this time point is calculated by the following equation: Crt=Ci*100/(Sq−Sp) where * is an operator symbol for multiplication.

The initial battery capacity Cini is known and thus the battery capacity decrease can be determined by Cini−Crt.

The OCV-SOC characteristics associated with the battery capacity decreases are determined in advance. The OCV-SOC characteristic is selected from the OCV-SOC characteristics according to the determined battery capacity decrease and used for the determination of the state of charge.

A process performed by the controller 2c of the battery monitoring system 2 will be explained with reference to the flowchart in FIG. 4.

The fundamental operation of the battery monitoring system 2 is to determine the state of charge (SOC) based on the measured open circuit voltage (OCV) and the OCV-SOC characteristic as described above. The battery monitoring system 2 functions as a state of charge determination means.

The battery monitoring system 2 does not continuously use one OCV-SOC characteristic and selects the OCV-SOC characteristic according to the levels of the degradation of the electric cells 1a.

Figure 4:
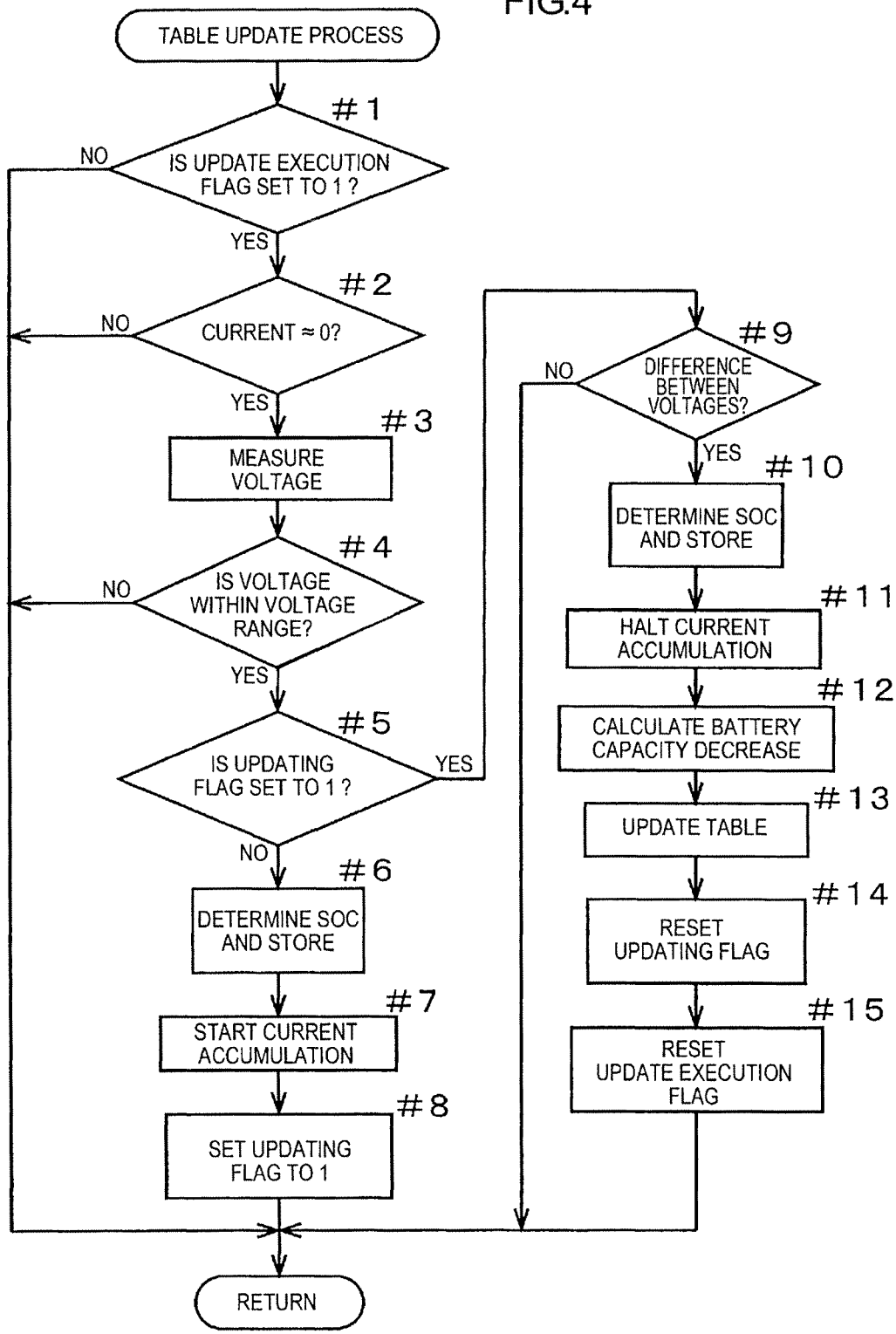
FIG. 4 is a flowchart regarding the embodiment of the present invention.

A table update process in FIG. 4 is a process for selecting the OCV-SOC characteristic to be used at a time point after the battery capacity decrease is determined.

The process in FIG. 4 is continuously performed at high speed. If an update execution flag is set to 1 at a time point in another process performed by the battery monitoring system 2, the controller 2c actually starts the process (step #1).

The controller 2c determines if the current flowing through the assembled battery 1 is substantially 0 based on detection information provided by the current sensor 5 (step #2). If the current is substantially 0, the assembled battery 1 is considered in an open circuit condition. The voltages across the electric cells 1a are measured by the voltmeter 2 at this time point and considered as open circuit voltages (step #3). The voltmeter 2a and the current sensor 5 function as an open circuit voltage measurement means OV for measuring the open circuit voltages.

Next, the controller 2c determines if the measured voltage is within a voltage range defined for the determination of the battery capacity decreases (step #4). If the measured voltage is with the voltage range, the voltage can be used for the determination.

Specifically, the controller 2c determines if, on the OCV-SOC characteristic curve in FIG. 2, the open circuit voltage range in the a region is within the voltage range for the determination of the battery capacity decreases (the open circuit voltage range for the capacity decrease estimation). Namely, the open circuit voltage is within the voltage range equal to or lower than 3.4 V or equal to or higher than 3.8 V.

If the measured voltage is within the voltage range (equal to or lower than 3.4 V or equal to or higher than 3.8 V), the controller 2c determines if the updating flag is set to 1 (step #5). In this embodiment, the battery capacity is determined based on the accumulated current between two open circuit voltages and the variation in SOC. If the open circuit voltages are not measured, the updating flag is set to 0. If the first open circuit voltage is measured, the updating flag is set to 1.

If the updating flag is 0, the controller 2c determines the state of charge (SOC) at the time point based on the open circuit voltage measured in step #3 and the OCV-SOC characteristic that is used at the time point, and the SOC in the memory unit 2d (step #6). For instance, in FIG. 2, if the measured open circuit voltage is Vp, the SOC Sp is stored in the memory unit 2d.

The controller 2c controls the current accumulator 2b to start the accumulation of the discharge currents from the assembled battery 1 and the charge currents to the assembled battery 1 based on the detection information from the current sensor 5 (step #7). Then, the controller 2c sets the updating flag to 1. The current accumulator 2b accumulates the discharge currents and the charge currents in consideration of signs (one having an inverted sign from another).

If the currents flowing through the assembled battery 1 become substantially 0 (step #2), the controller 2c measures the open circuit voltage as in the same manner described earlier, and determines if the measured voltage (e.g., Vp) is within the predetermined voltage range described earlier (steps #3 and #4).

At this point, because the updating flag is 1 (step #5), the controller 2c determines if the difference between the previous measured open circuit voltage Vp and the current open circuit voltage WI is equal to or higher than a reference voltage (step #9). If the difference between Vp and Vq is very small, the variation in SOC cannot be accurately converted to the battery capacity. Therefore, the difference between the voltages needs to be a certain amount. The reference voltage may be defined appropriate for the accuracy of the battery capacity to be determined.

If the difference between Vq and Vp is equal to or higher than the reference voltage (step #9), the controller 2c determines the state of charge at that point (i.e., Sq) based on the open circuit voltage Vq and the OCV-SOC characteristic used at that time, and stores the SOC in the memory unit 2d (step #10). The controller 2c controls the current accumulator 2b to halt the accumulation of the currents (step #11).

Next, the controller 2c obtains the accumulated current Ci from the current accumulator 2b and calculates the battery capacity decrease (step #12).

Specifically, the controller 2c calculates the battery capacity Crt at that point using the following equation: Crt=Ci*100/(Sq−Sp) as described earlier. Then, the controller 2c calculates a difference between Crt and Cini (Cini−Crt) as a battery capacity decrease. Cini is the initial battery capacity scored in the memory unit 2d.

In the open circuit voltage range in which the SOC is smaller than 100%, the controller 2c can obtain the accumulated current without waiting until the assembled battery 1 is fully charged by measuring the accumulated current. Therefore, chances of the measurement can be easily obtained.

The controller 2c selects the OCV-SOC characteristic corresponding to the determined battery capacity decrease from those in the data table in the memory unit 2d, and then updates the currently used OCV-SOC characteristic to the selected OCV-SOC characteristic (step #13).

A series of steps is complete. The controller 2c resets the updating flag and the update execution flag to 0 (steps #14 ad #15).

The controller 2c determines the state of charge based on the OCV-SOC characteristic updated in step #13 and the measured open circuit voltage from now on.

Other Embodiments

Other embodiments will be listed below.

(1) In the above embodiment, the voltage is measured after the current is determined as substantially 0 based on the detection information from the current sensor 5 to measure the open circuit voltage. However, the electrical connection between the assembled battery 1 and the charging power source 3 may be terminated by a switch, and the open circuit voltage may be compulsory measured.

In the case that the open circuit voltage is measured in such a manner, the open circuit voltages may be measured at points of time and fixedly set as the open circuit voltages for the determination of the battery capacity at the measured points (Vp and Vq in the above embodiment).

If the open circuit voltages are fixedly set as the open circuit voltages Vp and Vq for the determination of the battery capacity at the measured points, the battery capacity Crt is not needed to be calculated from the difference in SOC (Sq−Sp) as in the above embodiment.

The accumulated current between the initial SOC Sp and the SOC Sq may be stored in the memory 2d as the value corresponding to the initial battery capacity (at the reference time point) instead of the initial battery capacity Cini (at the reference time point) used in the above embodiment. The battery capacity decrease may be determined by directly comparing the battery capacity with the initial battery capacity Cini used in the above embodiment.

In this case, the date in the data table in the memory unit 2d that stores the relationship between the battery capacity decreases since the initial battery capacity (at the reference time point) and the OCV-SOC characteristics may be based on the accumulated current between the SOC Sp and the SOC Sq.

(2) In the above embodiment, the state of charge is determined under the condition that the assembled battery 1 is connected to the charging power source 3 and the load 4. The charge currents to the assembled battery 1 and the discharge current from the assembled battery 1 may be with inverted sings are accumulated. If the assembled battery 1 is only connected to the load 4 and used only in a discharging condition, only the discharge currents need to be accumulated. If the assembled battery 1 is only connected to the charging power source 3 and used in a charging condition, only the charge currents need to be accumulated.

(3) In the above embodiment, the difference between the initial battery capacity and the battery capacity at the measurement time point (Cini−Crt) is used for the determination of the battery capacity decrease. However, a different method may be used for calculating an evaluation value used for the determination. For example, a radio (Crt/Cini) may be used for the determination of the battery capacity decrease.

(4) In the above embodiment, the predetermined relationships between the battery capacity decreases and the OCV-SOC characteristics are stored in the data table. However, a different configuration may be used. For example, how the CCV corresponding to the SOC in the region indicated by symbol β in FIG. 2 varies according to a variation in battery capacity decrease may be determined by functional approximation for each SOC. The OCV corresponding the SOC may be determined by the functional approximation based on the determined battery capacity decrease. The OCV-SOC characteristic to be used may be defined based on the determined OCV.

(5) In the embodiment, the OCV-SOC characteristic is selected based on the determined battery capacity decrease, and the OCV-SOC characteristic to be used for the determination of the state of charge is updated. However, the entire OCV-SOC characteristic may not need to be updated. Only the data in the region indicated by symbol β in FIG. 2, in which the OCV-SOC characteristic changes, may be updated.

(6) In the above embodiment, the electric cells 1a included in the assembled battery 1 are used as secondary batteries. However, the scope of the present invention can be applied to electric cells that are used without being assembled into an assembled battery.

(7) In the above embodiment, the accumulated current is obtained by accumulating the charge currents and the discharge currents in the process in which the state of charge changes between two open circuit voltages Vp and Vq. However, the accumulated current maybe obtained by accumulating the charge currents in a process in which the state of charge changes among three or more open circuit voltages.

In this case, the accumulated currents and the SOCs may be plotted in a chart and a detection error may be reduced as much as possible by the least-square method. Then, the relationships between the SOCs and the accumulated currents may be determined.

EXPLANATION OF SYMBOLS

1a: Secondary battery
CS: Current accumulating means
MM: memory means
OV: Open circuit voltage measuring means

The invention claimed is:

1. A secondary battery state of charge determination apparatus, comprising:
a voltmeter configured to measure an open circuit voltage of a secondary battery; and
a controller configured to cause the voltmeter to measure the open circuit voltage of the secondary battery at plural time points within a first region in
an open-circuit-voltage-to-state-of-charge (OCV-SOC) characteristic of the secondary battery, the OCV-SOC characteristic comprising the first region in which the OCV-SOC characteristic is less likely to vary due to a degradation of the second battery since a reference time point and a second region in which the OCV-SOC characteristic is more likely to vary due to the degradation of the second battery since the reference time point,
wherein the controller determines a secondary battery state of charge using values measured in the first region.

2. The secondary battery state of charge determination apparatus according to claim 1, further comprising a current accumulator configured to accumulate charge currents for charging the secondary battery and discharge currents flowing from the secondary battery during a discharge of the secondary battery,
wherein the controller is further configured to:
cause the current accumulator to accumulate at least one of the charge currents and the discharge currents in a process in which a secondary battery state of charge changes as an open circuit voltage varies from one level to another level in the first region; and
estimate a secondary battery capacity decrease based on the accumulated currents and a value of a battery capacity at the reference time point or a value corresponding to the battery capacity at the reference time point.

3. The secondary battery state of charge determination apparatus according to claim 2, further comprising a memory unit configured to store data on:
relationships between an amount that a secondary battery capacity has decreased since the reference time point and OCV-SOC characteristics; and
the value of the battery capacity at the reference time point or the value corresponding to the battery capacity at the reference time point,
wherein the controller is further configured to:
specify an OCV-SOC characteristic based on the estimated secondary battery capacity decrease and the stored data on relationships; and determine a secondary battery state of charge based on the open circuit voltage measured by the voltmeter and the specified OCV-SOC characteristic.

4. The secondary battery state of charge determination apparatus according to claim 1, wherein the first region includes at least one of a region in which the open circuit voltage is equal to or lower than 3.4 V and a region in which the open circuit voltage is equal to or higher than 3.8 V.

5. A method of determining state of charge of a secondary battery, the method comprising:
identifying that an open-circuit-voltage-to-state-of-charge (OCV-SOC) characteristic of a secondary battery comprises a first region in which the OCV-SOC characteristic is less likely to vary due to a degradation of the second battery since a reference time point and a second region in which the OCV-SOC characteristic is more likely to vary due to the degradation of the second battery since the reference time point;
measuring an open circuit voltage of a secondary battery at plural time points within the first region; and
determining a secondary battery state of charge,
wherein the determining determines a secondary battery state of charge using values measured in the first region.

6. The method according to claim 5, further comprising:
accumulating charge currents for charging the secondary battery and discharge currents flowing from the secondary battery during a discharge of the secondary battery such that the secondary battery state of charge changes as an open circuit voltage varies from one level to another level in the first region.

7. The method according to claim 6, further comprising:
estimating a secondary battery capacity decrease based on the accumulated charge currents and a value of a battery capacity at the reference time point.

* * * * *